United States Patent [19]
Glenn et al.

[11] Patent Number: 5,508,206
[45] Date of Patent: Apr. 16, 1996

[54] METHOD OF FABRICATION OF THIN SEMICONDUCTOR DEVICE

[75] Inventors: Gregory S. Glenn, Pacific Palisades; B. Terence Cavicchi, North Hollywood, both of Calif.

[73] Assignee: Spectrolab, Inc., Sylmar, Calif.

[21] Appl. No.: 415,221

[22] Filed: Mar. 28, 1995

Related U.S. Application Data

[63] Continuation of Ser. No. 168,112, Dec. 14, 1993, abandoned.

[51] Int. Cl.$^6$ .................................................. H01L 31/18
[52] U.S. Cl. .......................... 437/2; 136/256; 216/52; 257/466; 437/5; 437/226; 437/249
[58] Field of Search .................... 136/256; 437/2–5, 437/226, 249; 257/466; 216/52

[56] References Cited

U.S. PATENT DOCUMENTS

| | | | |
|---|---|---|---|
| 3,971,672 | 7/1976 | Lampkin | 136/246 |
| 5,017,243 | 5/1991 | Otsubo | 136/244 |
| 5,397,400 | 3/1995 | Matsuno et al. | 136/256 |

FOREIGN PATENT DOCUMENTS

| | | | |
|---|---|---|---|
| 57-85270 | 3/1982 | Japan | 136/256 |
| 63-5576 | 1/1988 | Japan | 136/256 |
| 2-244681 | 9/1990 | Japan | 136/256 |
| WO86/05923 | 10/1986 | WIPO | 136/256 |

*Primary Examiner*—Aaron Weisstuch
*Attorney, Agent, or Firm*—Elizabeth E. Leitereg; Terje Gudmestad; W. K. Denson-Low

[57] ABSTRACT

Thin semiconductor devices, such as thin solar cells, and a method of fabricating same are disclosed. A microblasting procedure is employed to thin a semiconductor wafer or substrate, such as a solar cell wafer, wherein fine abrasive particles are used to etch away wafer material through a mask. Thick areas remain at the perimeter of the semiconductor device or solar cell, in regions of the semiconductor device or solar cell behind the front interconnect attachment pads, and at corresponding rear interconnect attachment areas. In addition, there are thick areas in a pattern that comprise interconnected beams that support the thin wafer areas. Consequently, predetermined areas of the wafer are thinned to form a predetermined structural pattern in the wafer that includes an external frame and a plurality of interconnected beams. The final configuration of the semiconductor device or solar cell has approximately 20% of the area at the original wafer thickness with the remaining 80% etched away to a relatively thin thickness.

15 Claims, 2 Drawing Sheets

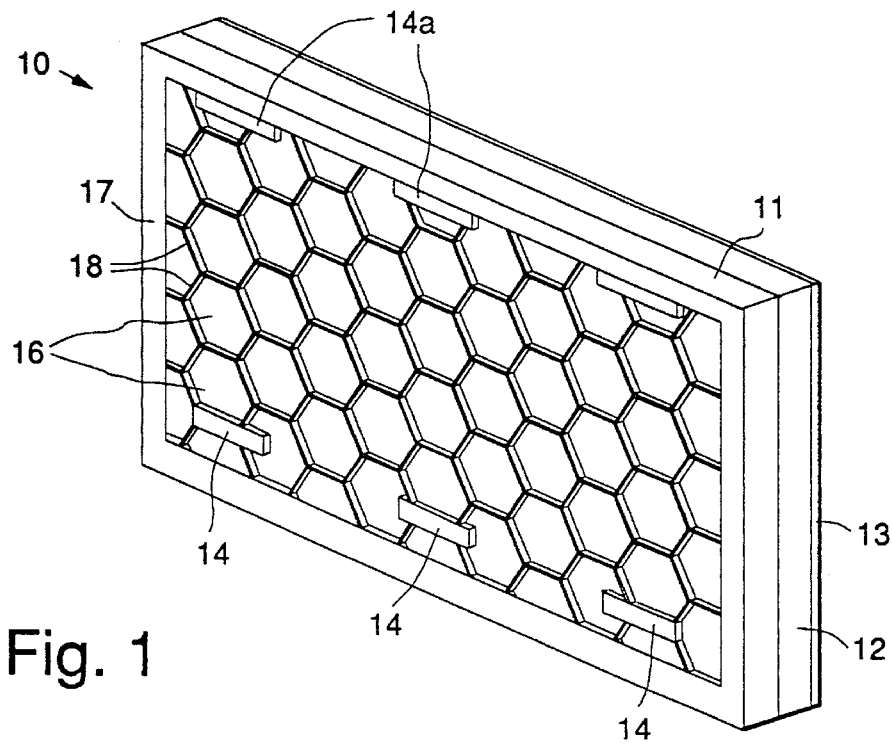
Fig. 1
Fig. 2
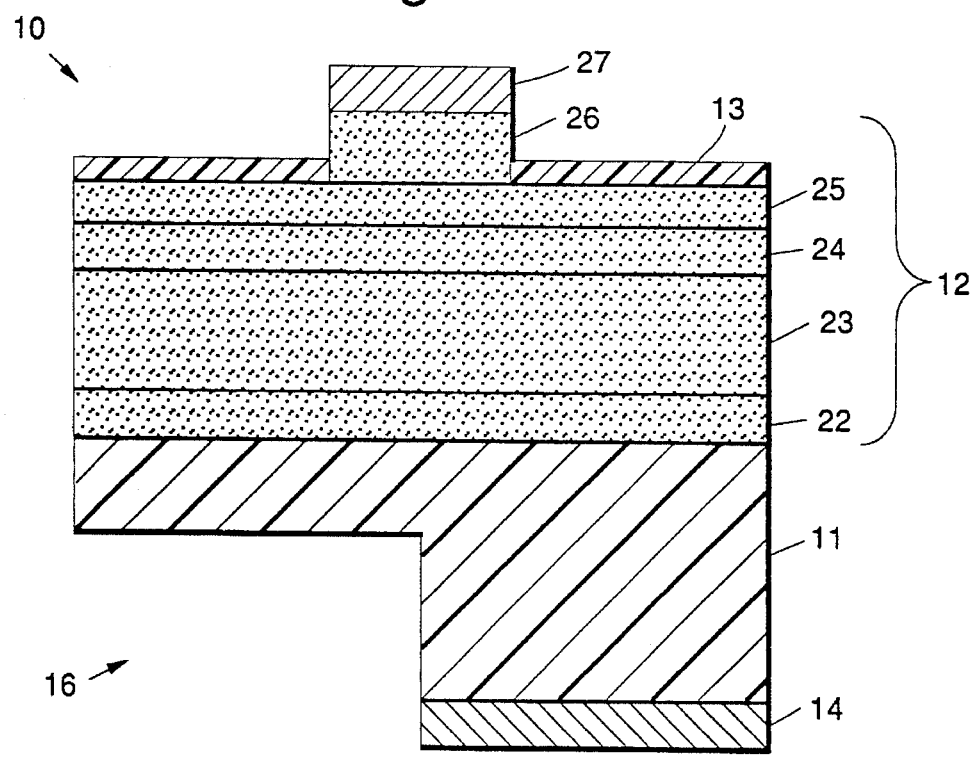

5,508,206

METHOD OF FABRICATION OF THIN SEMICONDUCTOR DEVICE

This a continuation application Ser. No. 08/168,112, filed Dec. 14, 1993, now abandoned.

BACKGROUND

The present invention relates generally to semiconductors and fabrication methods, and more particularly, to thin solar cell structures and a method of fabricating same.

The current technology for producing thin solar cells utilizes wet chemical etching to reduce the thickness of solar cell wafers (Si, III-V and II-VI) from about 0.007 inches thick down to approximately 0.0025 to 0.0035 inches thick. However, preferential chemical etching can open up lineages (line defects) in the wafer that leads to wafer breakage. Also, after the planar etching process, there is high attrition during subsequent cell manufacturing process steps and later during circuit assembly and panel bonding processes. It is also very difficult to attach silver interconnects to thin solar cells made by chemical etching procedures by welding processes, and almost impossible to weld Kovar or molybdenum interconnects thereto due to the high pressure required. Welded Kovar interconnects are known industry-wide to have high fatigue resistance for long term and extreme environment missions, and are therefore a preferred interconnect structure.

Satellite solar panel designers are continually striving to design high efficiency panels having low mass because of expensive satellite launch costs. Current satellite design goals place a premium on high power, and consequently there is a push for high efficiency solar panel technology. This makes GaAs and other III-V or II-VI type solar cells an attractive alternative to traditional Si solar cells. High efficiency solar cell substrates such as GaAs or Ge unfortunately have more than twice the mass penalty as Si-based solar cells and therefore must be substantially thinned to surpass the power per weight value of Si. This thinning results in high efficiency solar cells that are extremely fragile not only during cell and panel fabrication, but also throughout their life in the stressful space environment.

Accordingly, it is an objective of the present invention to provide for thin solar cell structures and a method of fabricating them that overcomes the limitations of conventional thin solar cells.

SUMMARY OF THE INVENTION

In order to meet the above objectives, the present invention provides for thin semiconductor devices, and solar cells in particular, and a method of fabricating same. In general, the semiconductor device comprises a substrate, and a predetermined number of semiconductor layers are disposed on a front surface of the substrate. Front contact metallization is disposed on a selected semiconductor layer, and rear contact metallization is disposed on the substrate. The front and rear contact metallization is sintered. Predetermined areas of the substrate are thinned to form a predetermined structural pattern in the substrate that includes an external frame and a plurality of interconnected beams that support the thin substrate.

In general, a method of fabricating a semiconductor device comprises the following steps.

1. Providing a substrate.

2. Forming a predetermined number of semiconductor layers on a front surface of the substrate.

3. Depositing front contact metallization on a selected semiconductor layer.

4. Depositing rear contact metallization on a surface of the substrate.

5. Sintering the front and rear contact metallization.

6. Disposing a mask adjacent the rear of the substrate.

7. Microblasting the substrate through the mask to thin selected areas of the substrate.

8. Providing original thickness areas at the perimeter of the substrate, and thick areas in regions of the substrate opposite the front contact metallization, and 9. The aforementioned thick areas having a pattern corresponding to the mask comprising interconnected beams that support the now thin substrate.

In an exemplary embodiment of the present invention, the solar cell comprises a wafer having a photovoltaic layer disposed on a front surface thereof. A plurality of front metal contacts are disposed on a portion of the front surface of the photovoltaic layer and an anti-reflection coating layer is disposed on a portion of the front surface of the photovoltaic layer. A single thick metal contact or a plurality of thick rear metal contacts are disposed on a rear surface of the wafer. Predetermined areas of the wafer are thinned to form a predetermined structural pattern in the wafer that includes an external frame and a plurality of interconnected beams.

One method of fabricating solar cells in accordance with the present invention comprises the following steps:

1. A wafer is provided and a photovoltaic layer is formed on the front surface of the wafer.

2. A front contact metallization is formed on a portion of the photovoltaic layer.

3. An anti-reflection coating layer is deposited on an adjacent portion of the photovoltaic layer.

4. A rear contact metallization is formed on a rear surface of the wafer.

5. Metallized contacts are sintered to cohere with the front and rear wafer surfaces.

6. A mask, that has a predetermined pattern, is disposed adjacent the rear of the wafer.

7. The wafer is bombarded with high velocity abrasive particles (microblasted) through the mask to thin selected areas thereof providing thick areas at the perimeter of the wafer, thick areas in regions of the wafer behind the front contact metallization, and thick areas corresponding to rear metallized contacts. The thick areas having a pattern corresponding to the mask and forming interconnected beams that support the thin wafer as well as the metallized contact areas.

8. Finally, individual solar cells are cut from the fabricated, selectively thinned, patterned wafer.

The present invention uses a microblasting procedure, wherein fine abrasive particles are used to etch away photovoltaic cell wafer material through a mask. The final configuration of the solar cell has approximately 20% of the area at the original wafer thickness with the remaining 80% etched away to a relatively thin (0.002–0.004 inch) thickness. The thick areas remain at the perimeter of the solar cell, in regions of the solar cell behind the front interconnect attachment pads and at corresponding rear interconnect attachment areas. In addition, there are thick areas in a pattern that comprise interconnected beams that support the thin wafer areas.

The present invention thus provides for a highly efficient and light weight solar cell that has the strength of a much thicker solar cell. Because of higher production yields, manufacturing costs are significantly less than for a conventional thin solar cell. The present fabrication process and solar cell configuration may also be applied to thin Si cells with a consequent increase in manufacturing yield.

The present invention results in much more robust solar cells than those produced by traditional methods. Kovar-type interconnects, for example, may be welded onto the solar cell with the same ease as when using standard 0.007 inch thick solar cells. Furthermore, the present solar cells are stronger than conventional thin solar cells during a satellite's mission life because they are more resistant to crack propagation during thermal cycling.

Any semiconductor device may be thinned using the principles of the present invention, and as such, it is not limited to only solar cells and their fabrication. The present invention may be employed in other applications, such as in fabricating high power devices wherein substrate thickness limits the ability to dissipate heat, for example.

Because high power, high efficiency solar panels are desirable, GaAs and other III-V or II-VI type cells are an attractive alternative to traditional Si cells. The present invention allows for the manufacture of mechanically robust, high output solar cells with little or no weight penalty. The thick perimeter, interconnect attachment pad structure, and interconnected cross beams lower the cost of manufacturing the solar cells by increasing yield. The present invention also provides for a lower cost and more reliable solar cell, and provides for the manufacture of efficient lightweight (thin) GaAs and Ge solar cell panels that increase the power of satellites on which they are used.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, find in which:

FIG. 1 is a perspective view of the rear side of a solar cell made in accordance with the principles of the present invention;

FIG. 2 shows an enlarged cross-section of the solar cell of FIG. 1; and

DETAILED DESCRIPTION

Figure 3:
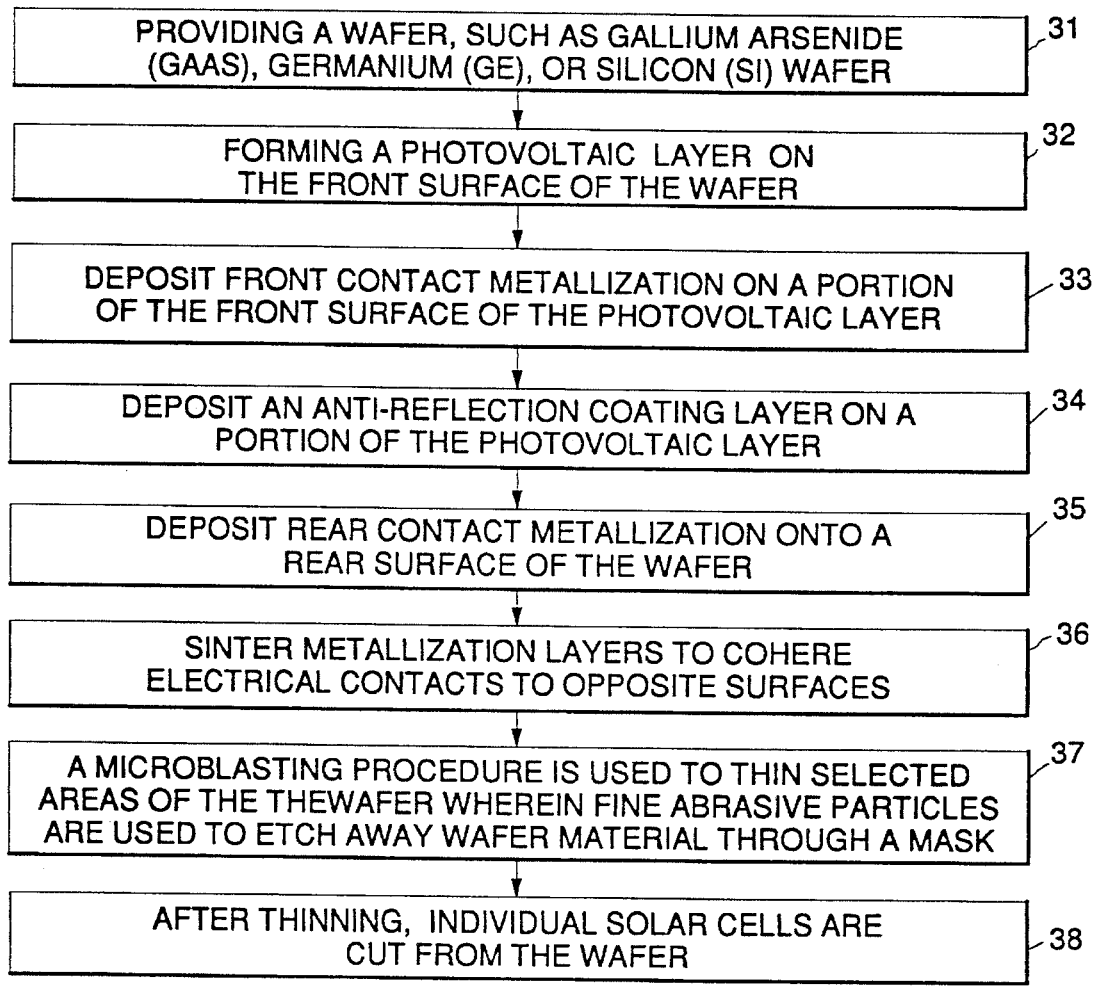
FIG. 3 is a flow diagram illustrating a method of fabricating a solar cell in accordance with the principles of the present invention.

Referring to the drawing figures, FIG. 1 is a perspective view taken from a rear side of a solar cell 10 made in accordance with the principles of the present invention. The solar cell 10 is comprised of a substrate 11, or wafer 11, such as a gallium arsenide (GaAs), germanium (Ge), or silicon (Si) wafer, having a thickness of about 0.007 inches. A series of deposited layers 12 (comprising five layers shown in FIG. 2) are disposed on a front surface of the wafer 11. A plurality of front metal contacts 27 (shown in FIG. 2) are disposed on fin exposed front-most layer of the series of deposited layers 12. One or more anti-reflection (AR) coating layers 13 are disposed on top of the series of deposited layers 12. A plurality of thick rear metal contacts 14 are disposed on a rear surface of the wafer 11. Kovar-type interconnects (not shown), for example, may be used by soldering or welding to the rear metal contacts 14 and front contacts 27 (shown in FIG. 2). Because of the low resistivity of gallium arsenide (GaAs) and germanium (Ge) wafers, for example, the rear metal contacts 14 may be metallized locally where a soldered or welded joint occurs to permit connection outside of the solar cell 10.

Predetermined areas 16, (thinned areas 16) of the wafer 11 are thinned using a microblasting procedure, for example, from a 0.007 inch original thickness to a thickness of about 0.002–0.004 inches. The thinning process comprises a repetitive rastering motion through a mask (not shown) that results in an even reduction in thickness of the wafer 11 over a relatively large area. This forms a wafer 11 having a honeycomblike structure, for example, as is shown in FIG. 1 that includes an external frame 17 and a plurality of interconnected beams 18. The configuration of the honeycomb-like structure is a function of the structure of the mask used during the microblasting procedure. Accordingly, different structural patterns may be formed in the wafer 11 depending upon the mask that is used. FIG. 1 shows an example of a thinned wafer 11 having hexagonal interconnected beams 18 and thick contact and perimeter areas (the frame 17) for assembly strength. Different interconnected beam structures such as squares, diamonds, triangles, ovals, rectangles, or circles may be similarly formed. The optimum design has the greatest strength for the least weight. Test results conducted to date show that germanium (Ge) wafers 11, for example, may be reliably and consistently thinned into complex patterns using a top mask aligned to the wafer.

The final configuration of the wafer 11 has approximately 20% of its area at the original wafer thickness and the remaining 80% etched away to the relatively thin (0.002–0.004 inch) thickness. The thick areas are disposed at the perimeter of the wafer 11, in regions 14a of the wafer 11 behind the front interconnect attachment pads or contacts, and at corresponding rear interconnect attachment areas adjacent the thick rear metal contacts 14. In addition, the thick areas are disposed in a pattern corresponding to the microblasting mask. These thick areas provide the frame 17 and interconnected beams 18 to support the thin areas 16 of the wafer 11.

The thinned area 16 may be made less than half the thickness of the original wafer 11 (approx. 0.0025 to 0.003 inches for a 0.007 inch thick wafer 11). The present solar cell 10 is designed to compensate for the 20–25% thin area 16 using the remaining thick frame 17 and interconnected beams 18 for strength. This results in a wafer 11 (and solar cell 10) that has half the mass of the original 0.007 inch thick wafer 11 but is substantially equal in mechanical strength.

FIG. 2 shows an enlarged cross-section of the thinned solar cell 10 of the present invention. The thick portion of the wafer 11, such as one of the beams 18 is shown on the right side of FIG. 2, which transitions into the thinned area 16 to the left of the beam 18. As is shown in FIG. 2, the solar cell 10 is comprised of the substrate or wafer 11 onto which a metal layer 14 is deposited that provides for the contact areas to which metal interconnects (not shown) are coupled. The series of deposited layers 12 is comprised of a GaAs buffer layer 22, a GaAs base layer 23, a GaAs emitter layer 24, an AlGaAs window layer 25 and a GaAs cap layer 26. Each of these individual layers 22–26 is deposited by means of a chemical vapor deposition process. A metal contact layer 27 that comprises a P-type contact, is formed on top of the GaAs cap layer 26. In general, the fabrication of the solar cell 10 is generally well known, and it is the formation of the thinned areas 16 that is the focus of the present invention.

FIG. 3 is a flow diagram illustrating a method 30 of fabricating the solar cell 10 in accordance with the principles of the present invention. The specific process flow may vary greatly depending upon the particular equipment and practices of a particular manufacturer, but the presently preferred embodiment of the solar cell fabrication method 30 is as follows.

A substrate 11, or wafer 11, such as gallium arsenide (GaAs), germanium (Ge), or silicon (Si) wafer is provided, as shown in step 31. Then, a photovoltaic layer 12 is grown on the front surface of the wafer 11 by means of a metal oxide chemical vapor deposition (MOCVD) procedure, or a diffusion procedure, for example, as shown in step 32. Then, front contact metallization 27 is applied to a portion of the front surface of the photovoltaic layer 12, as shown in step 33. Then one or more antireflection (AR) coating layers 13 are deposited on an exposed portion of the photovoltaic layer 12, as shown in step 34. Then, rear contact metallization 14 is deposited onto the rear surface of the wafer 11, as shown in step 35. Then the rear metallized contacts 14 and front metallized contacts 27 are sintered to cohere the metal to the wafer surfaces, as shown in step 36.

Then, in accordance with the present invention, a microblasting procedure is used to thin selected areas of the the wafer 11 from a thickness of about 0.007 inch to a thickness of about 0.002–0.004 inches, as shown in step 37. In the microblasting procedure, fine abrasive particles are used to etch away wafer material through a mask. The final configuration of the wafer 11 has approximately 20% of its area having its original thickness and the remaining 80% etched away to the relatively thin (0.002–0.004 inch) thickness. The thick areas remain at the perimeter of the wafer 11, in regions of the wafer 11 opposite the front interconnect metallization 27 and at corresponding rear interconnect attachment areas. In addition, there are thick areas in a pattern corresponding to the mask that comprise the beams 18 that support the thin wafer 11. Finally, after thinning, individual solar cells 10 are cut from the wafer 11, as shown in step 38.

The present invention thus provides for a highly efficient and light weight solar cell 10 that has the strength of a much thicker conventional solar cell. Because of higher production yields, manufacturing costs ,are significantly less than for a conventional thin solar cell. The present fabrication method 30 and solar cell 10 may embody gallium arsenide (GaAs), germanium (Ge), or silicon (Si) or multijunction solar cells with a consequent increase in manufacturing yield. The present invention results in much more robust solar cells than those produced by traditional methods. The present solar cells 10 are stronger than conventional thin solar cells because they are more resistant to crack propagation due to thermal cycling.

The present invention allows for the manufacture of mechanically robust, high output solar cells 10 with little or no weight penalty. The thick perimeter, interconnect attachment pad structure, and interconnected cross beams lower the cost of manufacturing the solar cells 10 by increasing yield. A major advantage to thinning wafers using the present method 30 is that the thinning operation takes place near the end of the solar cell manufacturing process, thus reducing handling of the thinned solar cell 10. The present invention may be employed in other applications, such as in fabricating high power devices wherein substrate thickness limits the ability to dissipate heat, for example.

Thus there has been described a new and improved thin semiconductor structures including those for solar cells and a method of fabricating them that overcome the limitations of conventional thin semiconductors and solar cells. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of fabricating a semiconductor device comprising the steps of:

providing a substrate;

forming a predetermined number of semiconductor layers on a front surface of the substrate;

depositing front contact metallization on a selected semiconductor layer;

depositing rear contact metallization on a surface of the substrate;

sintering the front and rear contact metallization;

disposing a mask adjacent the rear of the substrate; and controllably microblasting of the substrate through the mask to thin predetermined selected areas of the substrate to provide thick areas at the perimeter of the substrate, thick areas in regions of the substrate opposite the front contact metallization, and wherein the thick areas have a repeated structural pattern corresponding to the mask and comprise interconnected beams that support the thin substrate.

2. The method of claim 1 wherein the semiconductor device comprises a plurality of solar cells formed on the substrate, and wherein the step of forming a predetermined number of semiconductor layers on a front surface of the substrate comprises forming a photovoltaic layer on a front surface of the wafer, and wherein the method further comprises the steps of depositing an anti-reflection coating layer on a portion of the photovoltaic layer, and cutting individual solar cells from the substrate.

3. The method of claim 1 wherein the step of providing a substrate comprises providing a gallium arsenide substrate.

4. The method of claim 1 wherein the step of providing a substrate comprises providing a germanium substrate.

5. The method of claim 1 wherein the step of providing a substrate comprises providing a silicon substrate.

6. The method of claim 1 wherein the step of forming a photovoltaic layer on a front surface of the substrate comprises depositing the photovoltaic layer by means of a metal oxide chemical vapor deposition (MOCVD) procedure.

7. The method of claim 1 wherein the step of forming a photovoltaic layer on a front surface of the substrate comprises forming the photovoltaic layer by means of a diffusion procedure.

8. A method of fabricating solar cells comprising the steps of:

providing a wafer;

forming a photovoltaic layer on a front surface of the wafer;

depositing front contact metallization on a portion of the photovoltaic layer;

depositing an anti-reflection coating layer on a portion of the photovoltaic layer;

depositing rear contact metallization on a rear surface of the wafer;

sintering the front and rear contact metallization;

disposing a mask adjacent the rear of the wafer;

microblasting the wafer through the mask in a controlled manner to thin predetermined areas of the wafer to provide thick areas at the perimeter of the wafer, thick areas in regions of the wafer opposite the front contact metallization, and wherein the thick areas have a repeating structural pattern corresponding to the mask and comprise interconnected beams that support the thin wafer; and cutting individual solar cells from the wafer.

9. A method of fabricating a semiconductor device comprising the steps of:

providing a substrate;

forming a predetermined number of semiconductor layers on a front surface of the substrate;

depositing front contact metallization on a selected semiconductor layer;

depositing rear contact metallization on a surface of the substrate;

sintering the front and rear contact metallization; disposing a mask adjacent the rear of the substrate; and controllably microblasting of the substrate through the mask to thin predetermined areas of the substrate to provide thick areas at the perimeter of the substrate, thick areas in regions of the substrate opposite the front contact metallization, and wherein the thick areas have a repeating structural pattern corresponding to the mask and comprise interconnected beams that support the thin substrate.

10. The method of claim 9 wherein the semiconductor device comprises a plurality of solar cells formed on the substrate, and wherein the step of forming a predetermined number of semiconductor layers on a front surface of the substrate comprises forming a photovoltaic layer on a front surface of the wafer, and wherein the method further comprises the steps of depositing an anti-reflection coating layer on a portion of the photovoltaic layer, and cutting individual solar cells from the substrate.

11. The method of claim 9 wherein the step of forming a photovoltaic layer on a front surface of the substrate comprises depositing the photovoltaic layer by means of a metal oxide chemical vapor deposition (MOCVD) procedure.

12. The method of claim 9 wherein the step of forming a photovoltaic layer on a front surface of the substrate comprises forming the photovoltaic layer by means of a diffusion procedure.

13. The method of claim 9 wherein the step of providing a substrate comprises providing a gallium arsenide substrate.

14. The method of claim 9 wherein the step of providing a substrate comprises providing a germanium substrate.

15. The method of claim 9 wherein the step of providing a substrate comprises providing a silicon substrate.

* * * * *